United States Patent
Yamaguchi et al.

(10) Patent No.: US 7,188,024 B2
(45) Date of Patent: Mar. 6, 2007

(54) ELECTRONIC CONTROL DEVICE

(75) Inventors: Shingo Yamaguchi, Tokyo (JP); Shouzou Kanzaki, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 162 days.

(21) Appl. No.: 11/098,469

(22) Filed: Apr. 5, 2005

(65) Prior Publication Data
US 2006/0072365 A1 Apr. 6, 2006

(30) Foreign Application Priority Data
Oct. 4, 2004 (JP) ............................. 2004-291291

(51) Int. Cl.
*G06F 12/16* (2006.01)
*G06F 19/00* (2006.01)

(52) U.S. Cl. ...................... 701/115; 307/10.6; 73/117.3

(58) Field of Classification Search ................ 701/115, 701/114, 102; 307/10.1, 10.6, 10.3, 64, 85; 73/117.3; 123/480
See application file for complete search history.

(56) References Cited

U.S. PATENT DOCUMENTS

| 4,556,033 | A | * | 12/1985 | Ito et al. .................. 123/480 |
| 4,600,993 | A | * | 7/1986 | Pauwels et al. ............. 701/103 |
| 5,198,698 | A | * | 3/1993 | Paul et al. .................... 307/64 |
| 6,720,862 | B2 | * | 4/2004 | Hazelton et al. ........... 307/10.3 |
| 6,960,106 | B2 | * | 11/2005 | Matsuda ........................ 440/1 |
| 2003/0051538 | A1 | * | 3/2003 | Hashiguchi ................. 73/117.3 |

FOREIGN PATENT DOCUMENTS

JP 06-250940 A 9/1994

* cited by examiner

*Primary Examiner*—Hieu T. Vo
(74) *Attorney, Agent, or Firm*—Sughrue Mion, PLLC

(57) ABSTRACT

An electronic control device includes: a microprocessor that operates using electricity supplied from a battery through a switch operated in conjunction with an ignition switch, and a main power circuit; a volatile memory for temporarily storing data to be updated, the memory being operated using electricity supplied through the main power circuit, the electricity being also supplied from the battery constantly through an auxiliary power circuit as a backup power supply; an initial start signal generation unit for generating an initial start signal indicating that the ignition switch is turned on for the first time after electricity is supplied from the battery to the memory through the auxiliary power circuit; and a volatile memory initialization unit for initializing the memory according to the initial start signal when the ignition switch is turned on for the first time after electricity is supplied to the memory.

5 Claims, 5 Drawing Sheets

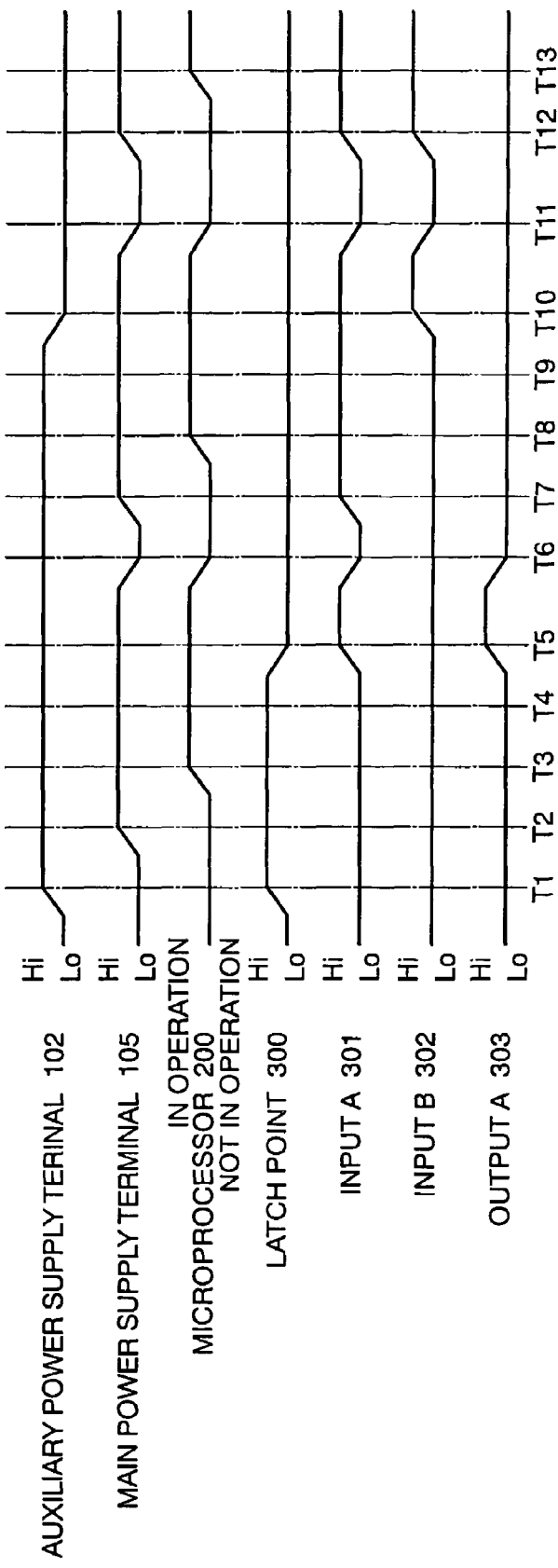

FIG. 5

| POWER FEEDING STATE FROM BATTERY | | T4–T5 | T8–T9 | T10, T13 |
|---|---|---|---|---|
| | AUXILIARY POWER SUPPLY TERMINAL 102 | Hi | Hi | Lo |
| | MAIN POWER SUPPLY TERMINAL 105 | Hi | Hi | Hi |
| INPUT A 301 OF MICROPROCESSOR | | Lo | Hi | Hi |
| INPUT B 302 OF MICROPROCESSOR | | Lo | Lo | Hi |
| DETERMINATION OF MICROPROCESSOR 200 | | DETERMINE THAT IGNITION SWITCH 104 IS TURNED ON FOR THE FIRST TIME AFTER CONNECTION OF BATTERY 101 | DETERMINE THAT IGNITION SWITCH 104 IS TURNED ON FOR THE SECOND TIME AFTER CONNECTION OF BATTERY 101 | DETERMINE AUXILIARY POWER SUPPLY FAILURE |
| PROCESS FOR OUTPUT A 303 OF MICROPROCESSOR AFTER THE DETERMINATION | | Lo→Hi | — | — |
| INITIALIZATION OF RAM OF MICROPROCESSOR 200 | | OPERATION | — | AT THE TIME OF RAM INITIALIZATION DETERMINATION : INITIALIZE RAM AFTER RAM INITIALIZATION DETERMINATION : DOES NOT INITIALIZE RAM |

ELECTRONIC CONTROL DEVICE

BACKGROUND OF THE INVENTION

1. Field of the Invention

The present invention relates to an electronic control device having a volatile memory for storing data therein for use, e.g., in control of an internal combustion engine in an automobile.

2. Description of the Related Art

Data such as a fuel injection amount, an air amount, and an ignition timing, which are used in an internal combustion engine may cause a difference from previously determined data due to fluctuation or deterioration over time. The difference is calculated as errors by a microprocessor in an electronic control device. Based on the calculated results, the errors of the fuel injection amount, the air amount, or the like are corrected. The microprocessor stores values of error correction as error correction data in a volatile memory such as a RAM. Even if an ignition switch is turned off, and electricity is not supplied from a battery to the RAM through a main power supply circuit, electricity is constantly supplied from the battery to the RAM through an auxiliary power supply circuit. Therefore, the RAM retains the error correction data.

The failure condition of components such as an actuator or a sensor used in the internal combustion engine is monitored by the microprocessor. When the microprocessor detects any failures, the microprocessor stores the failure data in the RAM.

The battery for supplying electricity to the electronic control device may be replaced due to deterioration or the like. Further, the battery may be disconnected for initializing the failure data stored in the RAM. When the supply of electricity from the battery through the auxiliary power supply circuit is stopped, depending on the time of interrupting the supply of electricity, data erasure is carried out incompletely. Therefore, the error correction data or the failure data stored in the RAM includes uncertain values. If control of the internal combustion engine is carried out using the error correction data or the failure data including the uncertain values, deterioration in the exhaust gas, or deterioration in drivability may occur. Therefore, when the battery is attached again and the ignition switch is turned on, the microprocessor needs to initialize the RAM.

For example, according to the description (system) of JP 6-250940 A, control data and inverted control data are stored as a pair of data in the RAM. When the supply of electricity from the battery through the auxiliary power supply circuit is stopped, depending on the time of interrupting the supply of electricity, data erasure is carried out incompletely. Therefore, the error correction data stored in the RAM includes uncertain values. At this time, the control data does not match the data obtained by inverting values of the inverted control data. Under the condition, the RAM is initialized.

When the condition for determining the initialization of the RAM in the electronic control device is used, if only part of the data stored in the RAM includes uncertain values created by disconnection of the battery, the control data may match the data obtained by inverting values of the inverted control data. Under the circumstances, the RAM is not initialized. The use of such control data results in deterioration in the exhaust gas or deterioration in drivability.

Further, since both of the control data and the inverted data need to be stored, the required storage capacity of the RAM is twice as much as the volume of the control data.

Further, the process of comparing the control data and the data obtained by inverting values of the inverted data needs to be performed before starting the internal combustion engine after the ignition switch is turned on. Since the entire area of the data in the RAM may need to be compared, considerable time may be required to achieve the condition ready for starting the internal combustion engine.

SUMMARY OF THE INVENTION

An object of the present invention is to provide an electronic control device in which the necessity of initializing a volatile memory is swiftly determined without requiring excessive memory capacity or time. In particular, the volatile memory is initialized only when operation of a microprocessor is started for the first time after the supply of electricity to the volatile memory is started. Further, the necessity of initializing the volatile memory is determined based on the power feeding state for supplying electricity to the volatile memory.

The present invention relates to an electronic control device including a microprocessor that operates using electricity supplied from a battery through a switching element that is operated in conjunction with an ignition switch, and a main power supply circuit; and a volatile memory for temporarily storing data to be updated, the volatile memory being operated using electricity supplied through the main power supply circuit, the electricity being also supplied from the battery constantly through an auxiliary power supply circuit so that the volatile memory retains the data by electricity supplied from the auxiliary power supply circuit even if electricity is not supplied from the main power supply circuit. The electronic control device also includes initial start signal generation means for generating an initial start signal indicating that the ignition switch is turned on for the first time after electricity is supplied from the battery to the volatile memory through the auxiliary power supply circuit; and volatile memory initialization means for initializing the volatile memory according to the initial start signal when the ignition switch is turned on for the first time after electricity is supplied to the volatile memory.

According to the embodiment of the present invention, the necessity of initializing the volatile memory is swiftly determined without requiring excessive memory capacity or time. In particular, the volatile memory is initialized only when operation of a microprocessor is started for the first time after the supply of electricity to the volatile memory is started. Further, the necessity of initializing the volatile memory is determined based on the power feeding state for supplying electricity to the volatile memory. Therefore, improvement in the efficiency of initializing the volatile memory is achieved.

BRIEF DESCRIPTION OF THE DRAWINGS

In the accompanying drawings:

FIG. 4 is a timing chart showing operation of the electronic control device according to the embodiment of the present invention, from the start of supplying electricity from a battery; and FIG. 5 is a table showing the relationship between respective signals at predetermined time points and operation of the microprocessor.

DESCRIPTION OF THE PREFERRED EMBODIMENTS

Embodiment 1

Figure 1:
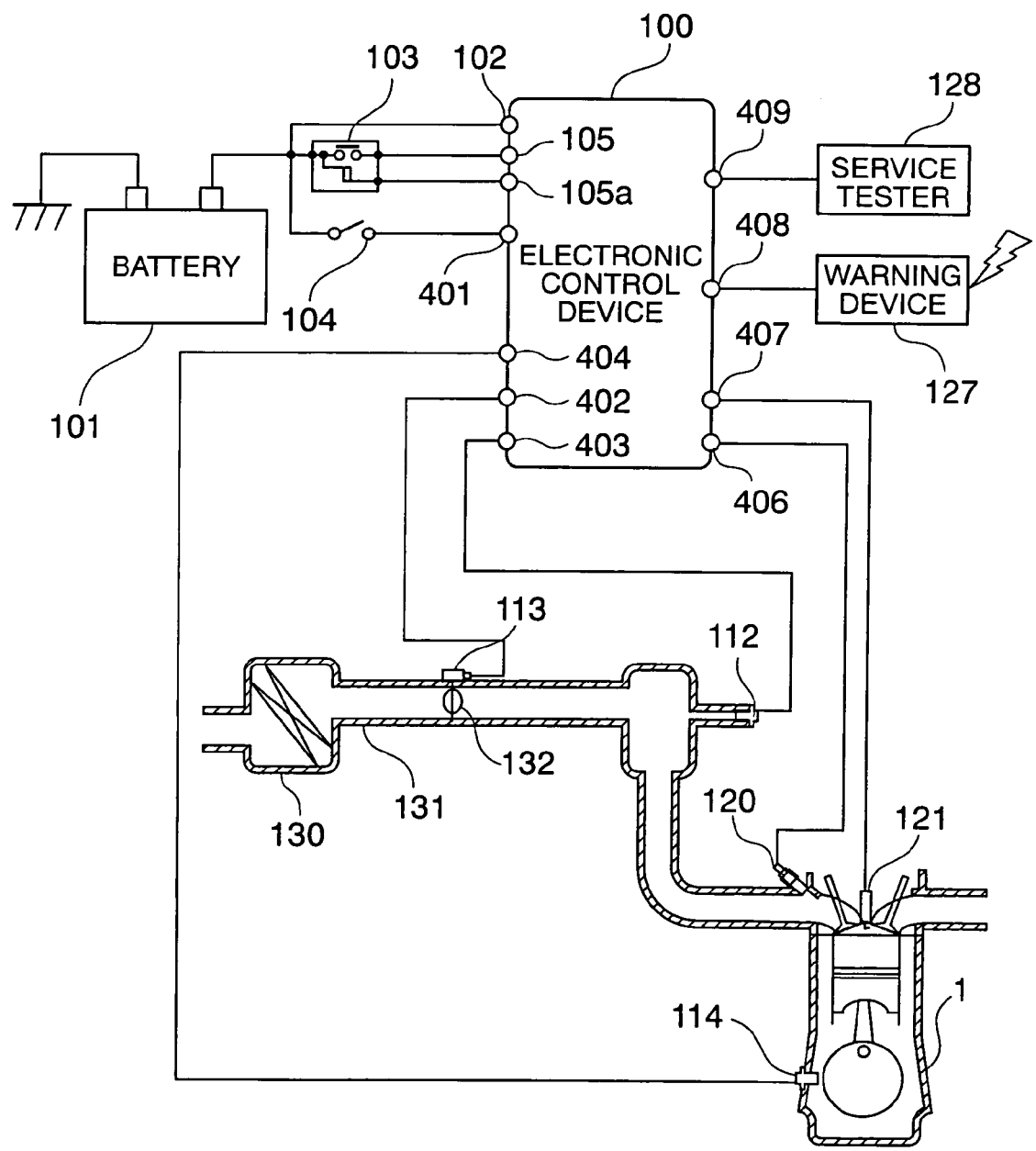
FIG. 1 is a diagram schematically showing a structure of a control system for an internal combustion engine including an electronic control device according to an embodiment of the present invention.

FIG. 1 is diagram schematically showing a structure of a control system for an internal combustion engine 1 including an electronic control device 100 according to Embodiment 1 of the present invention. In the internal combustion engine 1, the intake air flowing through an air intake pipe 131 is purified by an air cleaner 130, and the air amount is adjusted by a throttle 132. The amount of the intake air is detected by a pressure sensor 112 provided in the air intake pipe 131. Detection signals from a throttle position sensor 113 for detecting the position of the throttle 132, from an internal combustion engine rotational angle detection sensor 114 for detecting the rotational angle of the internal combustion engine 1, and from a pressure sensor 112 are inputted to the electronic control device 100 so that the electronic control device can recognize the condition of the internal combustion engine 1, and control components such as a fuel injector 120 for adjusting the injection amount of a fuel supplied to the internal combustion engine 1 and an ignition device 121.

The electronic control device 100 has a function to store correction data concerning the amount of fluctuation in the control of the internal combustion engine 1 based on previously stored data to reduce fluctuation in the control of the internal combustion engine 1. Further, the electronic control device 100 determines the condition of the internal combustion engine 1 and determines whether there is any failure in the sensors such as the pressure sensor 112 and the throttle position sensor 113. The electronic control device 100 sends the failure information and condition data of the internal combustion engine 1 to the outside, e.g., a user through a warning device 127 or a service tester 128. The correction data and the failure information are stored in the electronic control device 100. Further, electricity is supplied from a battery 101 to the electronic control device 100 through a power supply relay 103 or an ignition switch 104. Respective terminals of the electronic control device 100 with reference numeral are shown in FIG. 2.

Figure 2:
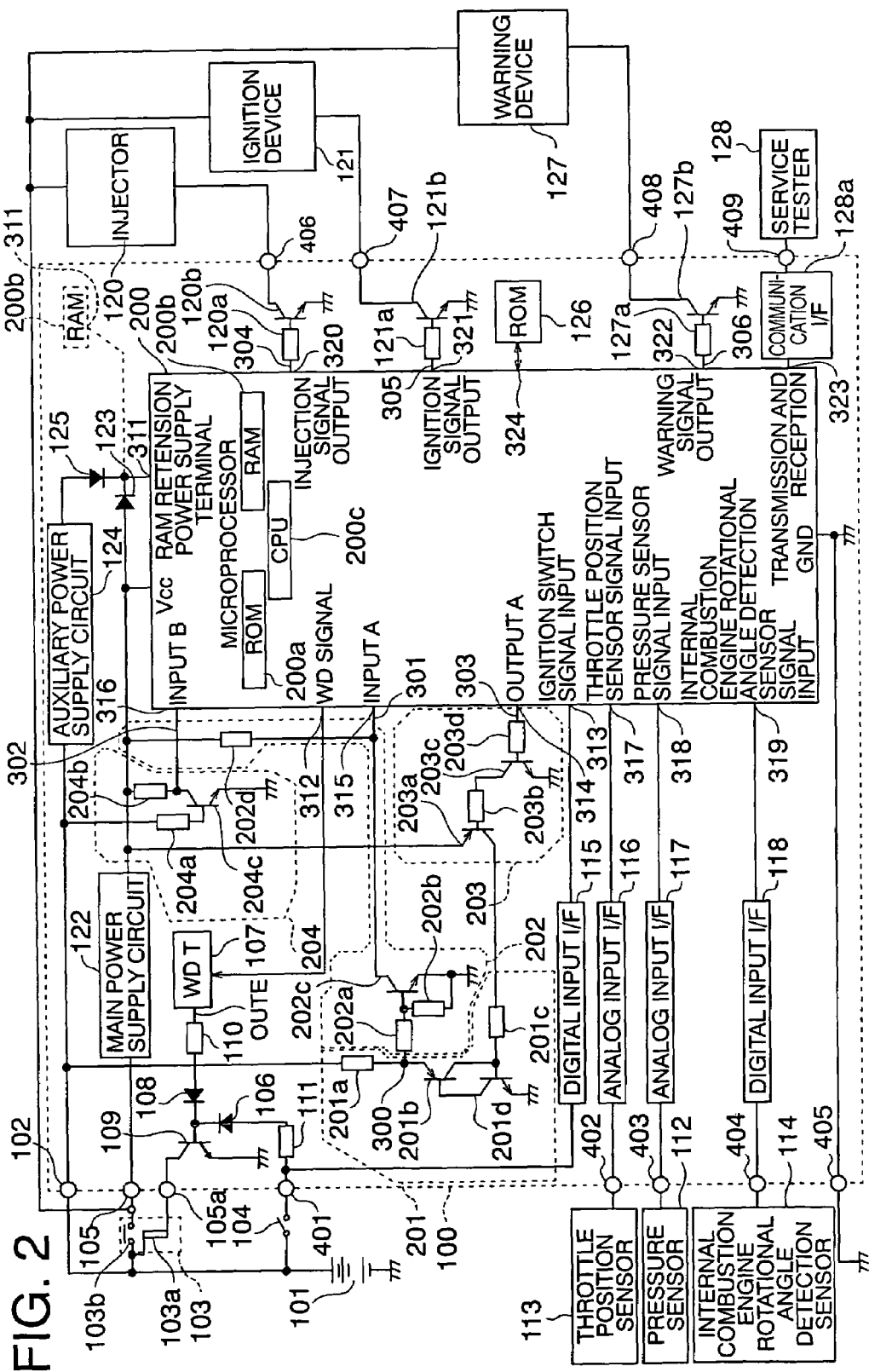
FIG. 2 is a diagram showing an example of the structure of the electronic control device in FIG. 1.

FIG. 2 is a diagram showing an example of the structure of the electronic control device 100. The battery 101 is connected to an auxiliary power supply terminal 102 of the electronic control device 100. Electricity is constantly supplied from the battery 101 to the auxiliary power supply terminal 102. The auxiliary power supply terminal 102 is connected to a RAM retention power supply terminal 311 of the microprocessor 200 through an auxiliary power supply circuit 124 and a diode 125.

Further, the battery 101 is connected to a terminal 401 of the electronic control device 100 through the ignition switch 104. The terminal 401 is connected to the base of a transistor 109 through an electrical current limiting resistor 111 and a diode 106. The collector of the transistor 109 is connected to one end of an electromagnetic coil 103a of the power supply relay 103 through a terminal 105a. The other end of the electromagnetic coil 103a is connected to the battery 101. The emitter of the transistor 109 is connected to the ground.

When the ignition switch 104 is turned on to supply electricity to the base of the transistor 109, electricity flows from the electromagnetic coil 103a to the collector of the transistor 109 to turn on (close) a switching element 103b of the power supply relay 103. One end of the switching element 103b is connected to the battery 101, and the other end of the switching element 103b is connected to a main power supply terminal 105. The main power supply terminal 105 is connected to a Vcc terminal of the microprocessor 200 through a main power supply circuit 122. When the switching element 103b is turned on, electricity is supplied from the battery 101 to the microprocessor 200 to start operation of the microprocessor 200.

When the microprocessor 200 operates normally, a WD signal from a terminal 312 causes a watchdog timer (WDT) circuit 107 to output a "Hi (H)" level signal (OUTE signal). The "Hi" level signal is transmitted to the base of the transistor 109 through an electronic current limiting resistor 110 and a diode 108. Thus, electrical current flows from the electromagnetic coil 103a to the collector of the transistor 109 to turn on the switching element 103b of the power supply relay 103. Therefore, when the microprocessor 200 operates normally, even if the ignition switch 104 is turned off, the supply of electricity to the microprocessor 200 is maintained. When an ignition switch signal indicating that the ignition switch 104 has been turned off is inputted to a terminal 313 of the microprocessor 200 through a digital input I/F (interface) 115, the microprocessor 200 recognizes that the ignition switch 104 has been turned off. Then, a CPU 200c of the microprocessor 200 performs an operation stop process. When the operation stop process is finished and the output of the WD signal is stopped, the output of the watchdog timer (WDT) circuit 107 is switched to the "Lo (L)" level. At this time, the switching element 103b is turned off (opened), and the supply of electricity through the main power supply terminal 105 is stopped.

Further, the electronic control device 100 is connected to the battery 101 through the auxiliary power supply terminal 102. Electricity is constantly supplied from the battery 101 to the auxiliary power supply terminal 102. As long as electricity is supplied to the RAM retention power supply terminal 311 of the microprocessor 200 through the auxiliary power supply circuit 124 and the diode 125, regardless of the condition of the switching element 103b, frequently updated data such as correction data or failure information is temporarily stored, e.g., in a RAM 200b as a volatile memory in the microprocessor 200.

When electricity is supplied from the main power supply circuit 122 to the Vcc terminal of the microprocessor 200, electricity is also supplied to the RAM retention power supply terminal 311 through a diode 123. The diodes 123 and 125 may include a logic circuit of a transistor, for example. Further, though the RAM 200b is indicated inside the microprocessor 200, a RAM 200b (indicated by a broken line) having a terminal similar to the RAM retention power supply terminal 311 may be connected to the outside of the microprocessor 200.

A latch circuit 201 (including components 201a to 201d and 300) will be described. An electrical current limiting resistor 201a is connected to the auxiliary power supply terminal 102, and also connected to the emitter of a transistor 201b. The base of the transistor 201b is connected to the collector of a transistor 201d. The collector of the transistor 201b is connected to the base of the transistor 201d. Further, an electrical current limiting resistor 201c is connected to the base of the transistor 201d. The emitter of the transistor 201d is connected to the ground. Once electricity is supplied to the electrical current limiting resistor 201c, even after the supply of electricity to the electrical current limiting resistor 201c is stopped, the transistors 201b and 201d are kept in the ON state until the electrical current flowing the emitter of the transistor 201b through the electrical current resistor 201a is interrupted. Therefore, a latch point 300 is maintained at the "Lo" level.

A latch set circuit 203 (including components 203a to 203d) will be described. An output A 303 from a terminal 314 of the microprocessor 200 is transmitted to the base of a transistor 203c through an electrical current limiting circuit 203d. The collector of the transistor 203c is connected to the base of a transistor 203a through an electrical current limiting circuit 203b. The emitter of the transistor 203c is connected to the ground. The collector of the transistor 203a is connected to the electrical current limiting resistor 201c of the latch circuit 201. The emitter of the transistor 203a is connected to the main power supply circuit 122. When the output A 303 from the terminal 314 of the microprocessor 200 indicates the "Hi" level, both of the transistors 203c and 203a are placed in the ON state, and electricity is supplied from the main power supply circuit 122 to the electrical current limiting resistor 201c of the latch circuit 201.

When electricity is supplied from the auxiliary power supply terminal 102, if the latch point 300 as the emitter of the transistor 201b in the latch circuit 201 is set to the "Lo" level by the latch set circuit 203, the "Lo" level is maintained as long as electricity is supplied from the auxiliary power supply terminal 102.

A determination circuit 202 (including components 202a to 202d) will be described. The latch point 300 of the latch circuit 201 is connected to the base of a transistor 202c through an electrical current limiting resistor 202a. A voltage divider resistor 202b is connected between the base and the emitter of the transistor 202c. The emitter of the transistor 202c is connected to the ground. The collector of the transistor 202c is connected to one end of a potential retaining resistor 202d and a terminal 315 of the microprocessor 200. The terminal 315 receives an input A 301 to the microprocessor 200. The other end of the potential retaining resistor 202d is connected to the main power supply circuit 122. When electricity is supplied from the main power circuit 122, if the latch point 300 is at the "Lo" level, the input A 301 of the microprocessor 200 is at the "Hi" level, and if the latch point 300 is at the "Hi" level, the input A 301 of the microprocessor 200 is at the "Lo" level.

A battery wiring disconnection detection circuit 204 (including components 204a to 204c) will be described. The battery 101 is connected to one end of an electrical current limiting resistor 204a through the auxiliary power supply terminal 102, and the other end of the electrical current limiting resistor 204a is connected to the base of a transistor 204c. The collector of the transistor 204c is connected to a terminal 316 of the microprocessor 200 and one end of a potential retaining resistor 204b. The terminal 316 receives an input B 302 to the microprocessor 200. The other end of the potential retaining resistor 204b is connected to the main power supply circuit 122. While the ignition switch 104 is turned on for supplying electricity from the main power supply circuit 122, when electricity is supplied from the battery 101 to the electrical current limiting resistor 204a through the auxiliary power supply terminal 102, the input B 302 of the microprocessor 200 is at the "Lo" level, and when electricity is not supplied from the battery 101 to the electrical current limiting resistor 204a through the auxiliary power supply terminal 102, the input B 302 of the microprocessor 200 is at the "Hi" level. Therefore, auxiliary power supply failure can be determined. The electrical current limiting resistor 204a may be connected between the auxiliary power supply circuit 124 and the diode 125.

Further, external devices, i.e., the throttle position sensor 113, the pressure sensor 112, and the internal combustion engine rotational angle detection sensor 114 are respectively connected to terminals 317 to 319 of the microprocessor 200 through terminals 402 to 404 of the electronic control device 100, analog input I/Fs 116 and 117, and a digital input I/F 118 for inputting a throttle position sensor signal, a pressure sensor signal, and an internal combustion engine rotational angle detection sensor signal to the microprocessor 200 (analog signals are used after A/D conversion in the microprocessor 200). An injection signal output 304, an ignition signal output 305, and a warning signal output 306 from terminals 320 to 322 of the microprocessor 200 are transmitted to electrical current limiting resistors 120a, 121a, and 127a, transistors 120b, 121b, and 127b, and terminals 406 to 408 of the electronic control device 100 to control external devices, i.e., the fuel injector 120, the ignition device 121, and the warning device 127. Further, data communication with the service tester 128 is performed using a communication I/F 128a between a terminal 323 of the microprocessor 200 and a terminal 409 of the electronic control device 100. Further, a rewritable ROM 126 is connected to a terminal 324 of the microprocessor 200.

The present invention relates to the electronic control device 100 including the microprocessor 200 and the volatile RAM 200b temporarily storing frequently updated data. The microprocessor 200 operates using electricity supplied from the battery 101 through the switching element 103b and the main power supply circuit 122. The switching element 103b is operated in conjunction with the ignition switch 104. Electricity is supplied from the battery 101 constantly to the RAM 200b through the auxiliary power supply circuit 124. Even if electricity is not supplied from the main power supply circuit 122, the data in the RAM 200b is retained by the supply of electricity from the auxiliary power circuit 124. In the electronic control device 100 having this structure, while the battery 101 is disconnected, data erasure in the RAM 200b may be carried out incompletely. The incomplete data erasure creates uncertain data. In order to avoid using the uncertain data, the battery 101 is connected to the auxiliary power supply circuit 124, and an initial start signal (indicating the first "turn on") is generated for determining whether the ignition switch 104 is turned on for the first time or for the second or subsequent time after the power supply to the RAM 200b. When the microprocessor 200 starts its operation, the initial start signal is used to determine whether the RAM 200b should be initialized or not. If the ignition switch 104 is turned on for the first time after electricity is supplied to the RAM 200b, the RAM 200b is initialized.

Generation of the initial start signal will be described. When the ignition switch 104 is turned on for the first time after the supply of electricity from the auxiliary power supply circuit 124 is started by connection of the battery 101 to the auxiliary power supply terminal 102, the input A 301 of the microprocessor 200 is at the "Lo" level. The latch point 300 is set to the "Lo" level by the microprocessor 200 when the ignition switch 104 is turned on for the first time. Then, when the ignition switch 104 is turned on for the second or subsequent time, the input A 301 of the microprocessor 200 is at the "Hi" level. Therefore, the microprocessor 200 can recognize whether the ignition switch 104 is turned on for the first time or for the second or subsequent time after electricity of the battery 101 is supplied from the auxiliary power supply terminal 102, based on the change in the level of the input A 301 (initial start signal) to the microprocessor 200. The initial start signal indicating the first "turn on" includes a signal in which the input A 301 is at the "Lo" level.

In the present invention, when the ignition switch 104 is turned on, and electricity is supplied from the main power supply circuit 122 to the microprocessor 200, an auxiliary power supply failure signal indicating a condition in which electricity is not supplied from the battery 101 through the auxiliary power supply circuit 124 (condition in which the battery 101 is not connected to the auxiliary power supply circuit 124) is generated. According to the auxiliary power supply failure signal, the RAM 200b is initialized or a warning is issued.

Generation of the auxiliary power supply failure signal will be described. While the ignition switch 104 is turned on for supplying electricity from the main power supply circuit 122, when the battery 101 supplies electricity to the electrical current limiting resistor 204a through the auxiliary power supply terminal 102 (condition in which the battery 101 is connected to the auxiliary power supply circuit 124), the input B 302 of the microprocessor 200 is at the "Lo" level, and when the battery 101 does not supply electricity to the electrical current limiting resistor 204a through the auxiliary power supply terminal 102 (condition in which the battery 101 is not connected to the auxiliary power supply circuit 124), the input B 302 of the microprocessor 200 is at the "Hi" level. The auxiliary power supply failure signal indicating the condition in which electricity is not supplied through the auxiliary power supply circuit 124 (condition in which the battery 101 is not connected to the auxiliary power supply circuit 124) includes a signal in which the input B 302 is at the "Hi" level.

Assuming that the battery 101 is connected to the auxiliary power supply terminal 102, the signal level of the initial start signal differs depending on whether the ignition switch 104 is turned on for the first time or for the second or subsequent time after connection of the battery 101 to the auxiliary power source terminal 102. However, when the battery 101 is not connected to the auxiliary power supply terminal 102, the transistor 202c of the determination circuit 202 is in the OFF state, and the input A 301 of the microprocessor 200 is at the "Hi" level, and thus, it is determined that the ignition switch 104 is turned on for the second or subsequent time. Under the circumstances, using the auxiliary power supply failure signal, the condition in which the battery 101 is not connected to the auxiliary power supply terminal 102 can be determined based on the condition of the input B 302 of the microprocessor 200. Therefore, when the auxiliary power supply failure is determined, the microprocessor 200 invalidates the determination by the initial start signal, and initializes the RAM 200b.

The warning indicating the auxiliary power supply failure is carried out by a warning signal output 306 of the microprocessor 200, the electrical current limiting resistor 127a, and the transistor 127b. When the microprocessor 200 determines the auxiliary power supply failure, the microprocessor 200 sends a signal to the warning device 127 disposed outside the electronic control device 100 to give a warning to a user, or stores the data of the auxiliary power supply failure in the rewritable ROM (which may be nonvolatile RAM) 126 connected to the terminal 324 of the microprocessor 200, and sends a code indicating the auxiliary power supply failure to the external service tester 128 through the communication I/F 128a. The ROM (or nonvolatile RAM) 126 is a memory which can store data even if electricity is not supplied to the auxiliary power supply terminal 102.

Initial start signal generation means includes the latch circuit 201, the determination circuit 202, the latch set circuit 203, and the microprocessor 200 (CPU 200c). Auxiliary power supply failure signal generation means includes the battery wiring disconnection detection circuit 204 and the microprocessor 200 (CPU 200c). Volatile memory initialization means and second volatile memory initialization means include the microprocessor 200 (CPU 200c). Auxiliary power supply failure warning means includes the microprocessor 200 (CPU 200c), the electrical current limiting resistor 127a, the transistor 127b, and the warning device 127. Auxiliary power supply failure storage means includes the microprocessor 200 (CPU 200c) and the ROM (or nonvolatile RAM) 126.

Figure 3:
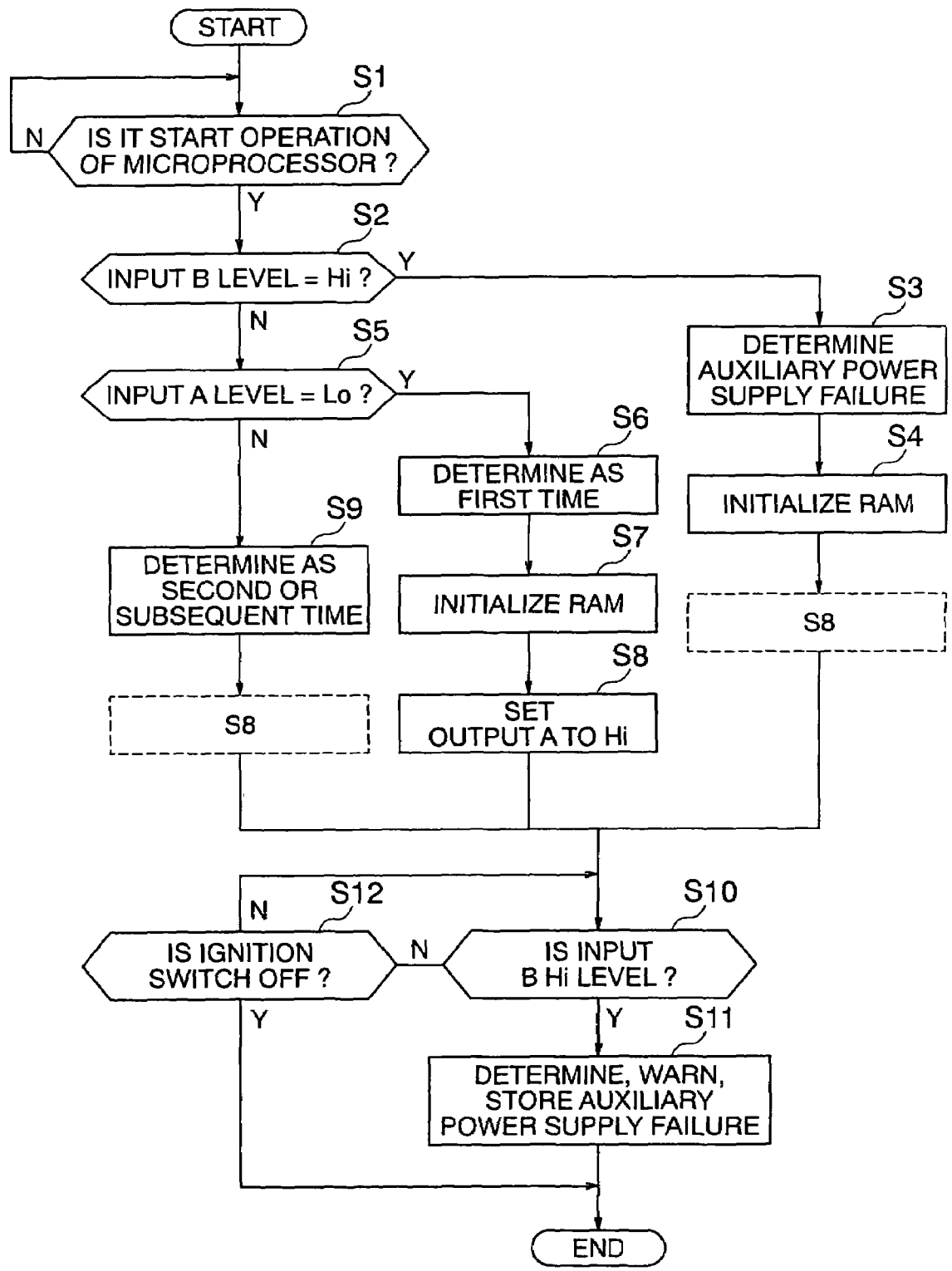
FIG. 3 is a flowchart showing processes performed by a microprocessor of the electronic control device according to the embodiment of the present invention.

FIG. 3 is a flowchart showing processes performed by the microprocessor 200 of the electronic control device 100 according to the embodiment of the present invention. The processes are performed when the ignition switch 104 is turned on to supply electricity from the battery 101 to the microprocessor 200 through the main power supply circuit 122, and the microprocessor 200 starts its operation.

In step S1, operation of the microprocessor 200 is started. In step S2, if it is determined that the input B 302 of the microprocessor 200 is at the "Hi" level, in step S3, the auxiliary power supply failure is determined since electricity is not supplied from the battery 101 to the auxiliary power supply terminal 102. Then, in step S4, the RAM 200b is initialized. The process of setting the output A 303 to the "Hi" level in step S8 as described later may be performed after the process in step S4.

In step S2, if it is determined that the input B 302 of the microprocessor 200 is at the "Lo" level, i.e., if it is determined that electricity is supplied from the battery 101 to the auxiliary terminal 102, the routine proceeds to step S5. In step S5, a process of confirming the condition of the input A 301 of the microprocessor 200 is performed. If the input A 301 of the microprocessor 200 is at the "Lo" level, in step S6, it is determined that the ignition switch 104 is turned on for the first time, and electricity is supplied from the battery 101 to the auxiliary power supply terminal 102. After the microprocessor 200 initializes the RAM 200b in step S7, the routine proceeds to step S8 for setting the output A 303 to the "Hi" level. In step S5, if the input A 301 of the microprocessor 200 is at the "Hi" level, in step S9, it is determined that the ignition switch 104 is turned on for the second or subsequent time, and electricity is supplied from the battery 101 to the auxiliary power supply terminal 102. The process of setting the output A 303 to the "Hi" level in step S8 may be performed after the process in step S9.

Thereafter, in the normal control in which electricity is supplied from the main power supply circuit 122 to the microprocessor 200, in step S10, if it is determined that the input B 302 of the microprocessor 200 is at the "Hi" level, and it is determined that electricity is not supplied from the battery 101 to the auxiliary power supply terminal 102, the RAM 202b is not initialized. In step S11, the auxiliary power supply failure is determined, and a warning is issued or data of the abnormal condition is stored, and then, the process is finished, for example. Further, in step S12, the process is finished when the ignition switch 104 is turned off.

FIG. 4 is a timing chart showing operation of the electronic control device 100 from the start of supplying electricity from the battery 101. FIG. 5 is a table showing the relationship between respective signals at time points T4–T5, T8–T9, and T10, T13 and operation of the microprocessor 200. In FIG. 4, before supplying electricity, the auxiliary power supply terminal 102 and the main power supply terminal 105 are at the "Lo" level (non-power feeding state), the microprocessor 200 is not in operation, and the latch point 300, the input A 301, the input B 302, and the output A 303 of the microprocessor 200 are at the "Lo" level, respectively. The time point T1 indicates a condition in which the supply of electricity (voltage supply) to the auxiliary power supply terminal 102 by connection of the battery 101 is started. Thus, the auxiliary power supply terminal 102 is switched to the "Hi" level (power feeding state), and the latch point 300 connected to the auxiliary power supply terminal 102 is also switched to the "Hi" level.

The time point T2 indicates a condition in which the ignition switch 104 is turned on to place the transistor 109 in the ON state, the switching element 103b of the power supply relay 103 is closed, and the supply of electricity to the main power supply terminal 105 is started. Thus, the main power supply terminal 105 is switched to the "Hi" level (power feeding state). The time point T3 indicates a condition in which electricity is supplied to the microprocessor 200 through the main power supply circuit 122, and operation of the microprocessor 200 is started. The time point T4 indicates a condition in which the microprocessor 200 determines that the ignition switch 104 is turned on for the first time after the supply of electricity to the auxiliary power supply terminal 102 is started since both of the input A 301 and the input B 302 of the microprocessor 200 are at the "Lo" level. The "Hi" level signal from the auxiliary power supply terminal 102 places both of the transistors 202c and 204c in the ON state. Therefore, both of the input A 301 and the input B 302 are maintained at the "Lo" level.

The time point T5 indicates a condition in which the RAM 200b of the microprocessor 200 is initialized, the output A 303 of the microprocessor 200 is set to the "Hi" level, and the latch point 300 is switched to the "Lo" level to switch the input A 301 of the microprocessor 200 to the "Hi" level. At this time, the microprocessor 200 initializes the RAM 200b, and switches the output A 303 to the Hi" level since both of the input B 302 and the input A 301 are at the "Lo" level, according to the processing sequence in steps S2, S5 to S8 in the flowchart of FIG. 3. Thus, the transistors 203c, 203a, 201d, and 201b are placed in the ON state, and the latch point 300 is switched to the "Lo" level. When the latch point 300 is switched to the "Lo" level, the transistor 202c is placed in the OFF state, and the input A 301 is switched to the "Hi" level. The "Lo" level of the latch point 300 is maintained by the transistors 201b and 201d until the supply of electricity to the auxiliary power supply terminal 102 is stopped.

The time point T6 indicates a condition in which the supply of electricity to the main power supply terminal 105 is stopped when the ignition switch 104 is turned off to open the switching element 103b. When the ignition switch 104 is turned off, the ignition switch signal indicating the "turn off" condition is inputted to the terminal 313 of the microprocessor 200 through the digital input I/F (interface) 115, and the microprocessor 200 recognizes that the ignition switch 104 is turned off, the CPU 200c carries out the operation stop process. When generation of the WD signal is stopped at the time of finishing the operation stop process and the output of the WDT circuit 107 is switched to the "Lo" level, the transistor 109 is placed in the OFF state, and the electrical current does not flow the electromagnetic coil 103a. The switching element 103b is opened, and the supply of electricity through the main power supply terminal 105 is stopped. Thus, the main power supply terminal 105 is switched to the "Lo" level (non-power feeding state). The microprocessor 200 stops its operation, the input A 301 from the main power supply terminal 105 is switched to the "Lo" level, and the output A 303 is switched back to the "Lo" level (see step S12 in FIG. 3).

The time point T7 indicates a condition in which the ignition switch 104 is turned on again to close the switching element 103b, and the supply of electricity to the main power supply terminal 105 is started. Thus, the main power supply terminal 105 is switched to the "Hi" level (power feeding state). Since the latch point 300 is at the "Lo" level, the transistor 202c is in the OFF state. Therefore, the input A 301 connected to the main power supply terminal 105 through the main power supply circuit 122 is switched to the "Hi" level. The time point T8 indicates a condition in which electricity is supplied to the microprocessor 200 through the main power supply circuit 122, and operation of the microprocessor 200 is started. The time point T9 indicates a condition in which the microprocessor 200 determines that the ignition switch 104 is turned on for the second or subsequent time after the supply of electricity to the auxiliary power supply terminal 102 is started since the input A 301 of the microprocessor 200 is at the "Hi" level, and the input B 302 of the microprocessor 200 is at the "Lo" level. The microprocessor 200 does not perform operation such as initialization of the RAM 200b since the input A 301 is at the "Hi" level and the input B 302 is at the "Lo" level, according to the processing sequence in steps S2, S5, and S9 in the flowchart of FIG. 3.

The time point T10 indicates a condition in which the supply of electricity to the auxiliary power supply terminal 102 is stopped during the normal control due to disconnection of the battery wiring or the like. The auxiliary power supply terminal 102 is switched to the "Lo" level (non-power feeding state), and the transistor 204c is placed in the OFF state. Thus, both of the input A 301 and the input B302 are switched to the "Hi" level, and the microprocessor 200 determines the auxiliary power supply failure. However, at this time, since the RAM initialization determination has already been made, the RAM 200b is not initialized. The warning signal output 306 is sent to the warning device 127 outside the electronic control device 100 to give a warning to a user, or data of the auxiliary power supply failure is stored in the rewritable ROM (or nonvolatile RAM) 126 connected to the terminal 324 of the microprocessor 200, and a code indicating the auxiliary power supply failure is sent to the external service tester 128 through the communication I/F 128a (see steps S10 and S11 in FIG. 3). Further, the time point T11 indicates a condition in which the ignition switch 104 in turned off to open the switching element 103b, and the supply of electricity to the main power supply terminal 105 is stopped. Thus, both of the auxiliary power supply terminal 102 and the main power supply terminal 105 are at the "Lo" level (non-power feeding state), and the microprocessor 200 stops its operation. All of the input A 301, the input B 302, and the output A 303 are at the "Lo" level.

The time point T12 indicates a condition in which the ignition switch 104 is turned on again to close the switching element 103b, and the supply of electricity to the main power supply terminal 105 is started. Since electricity is not supplied to the auxiliary power supply terminal 102 and both of the transistors 202c and 204c are in the OFF state, both of the input A 301 and the input B302 are at the "Hi" level. The time point T13 indicates a condition in which the ignition switch 104 is turned on to start the operation of the microprocessor 200. At this time, the microprocessor 200 makes the RAM initialization determination. The microprocessor 200 determines the auxiliary power supply failure and initializes the RAM 200b since both of the input A 301 and the input B 302 are at the "Hi" level (see steps S3 and S4 in FIG. 3).

In the same manner as the process in step S11 in FIG. 3, the warning signal output 306 concerning the auxiliary power supply failure may be sent to give a warning to a user, or data of the auxiliary power supply failure may be stored in the ROM (or the nonvolatile RAM) 126, and a code indicating the auxiliary power supply failure may be sent to the external service tester 128, concurrently with initialization of the RAM 200b in step S3 of FIG. 3. Further, the determination of the auxiliary power supply failure and the initialization of the RAM 200b may be notified by sending the warning signal output 306 to give a warning to the user, or data concerning the auxiliary power supply failure may be stored in the ROM (or nonvolatile RAM) 126, and a code indicating the auxiliary power supply failure may be sent to the external service tester 128.

In the structure, whether the ignition switch 104 is turned on for the first time, or for the second or subsequent time after connection to the battery 101 can be determined swiftly to initialize the RAM 200b as necessary. Further, when electricity is supplied to the main power supply terminal 105, it is possible to accurately determine whether electricity is supplied to the auxiliary power supply terminal 102 or not. Further, if electricity is not supplied to the auxiliary power supply terminal 102 after the ignition switch 104 is turned on, the determination as to whether the ignition switch is turned on for the first time or not is invalidated, and the RAM 200b is initialized to control the internal combustion engine 1 without using the control data including uncertain values in the RAM 200b.

Further, when it is detected that electricity is not supplied to the auxiliary power supply terminal 102, the RAM 200b storing uncertain error correction data or failure data due to the failure to supply electricity to the auxiliary power supply terminal 102 is initialized each time the ignition switch 104 is turned on. This condition is notified to a user as a warning of the abnormal condition.

Further, when it is detected that electricity is not supplied to the auxiliary power supply terminal 102, the auxiliary power supply failure is notified to the outside using the service tester 128 or the like by storing information indicating that electricity is not supplied to the auxiliary power supply terminal 102 in the ROM (or nonvolatile RAM) 126 which stores data even if electricity is not supplied.

What is claimed is:

1. An electronic control device comprising:
a microprocessor that operates using electricity supplied from a battery through a switching element that is operated in conjunction with an ignition switch, and a main power supply circuit;
a volatile memory for temporarily storing data to be updated, the volatile memory being operated using electricity supplied through the main power supply circuit, the electricity being also supplied from the battery constantly through an auxiliary power supply circuit so that the volatile memory retains the data by electricity supplied from the auxiliary power supply circuit even if electricity is not supplied from the main power supply circuit;
initial start signal generation means for generating an initial start signal indicating that the ignition switch is turned on for the first time after electricity is supplied from the battery to the volatile memory through the auxiliary power supply circuit; and
volatile memory initialization means for initializing the volatile memory according to the initial start signal when the ignition switch is turned on for the first time after electricity is supplied to the volatile memory.

2. An electronic control device according to claim 1, further comprising auxiliary power supply failure signal generation means for generating an auxiliary power supply failure signal when electricity is not supplied from the battery to the volatile memory through the auxiliary power supply circuit while the ignition switch is turned on to supply electricity from the main power supply circuit to the microprocessor.

3. An electronic control device according to claim 2, further comprising second volatile memory initialization means for disabling the volatile memory initialization means and initializing the volatile memory if the auxiliary power supply failure signal is generated when the ignition switch is turned on to supply electricity from the main power supply circuit to the microprocessor.

4. An electronic control device according to claim 2, further comprising auxiliary power supply failure warning means for issuing a warning to outside when the microprocessor determines auxiliary power supply failure according to the auxiliary power supply failure signal.

5. An electronic control device according to claim 2, further comprising auxiliary power supply failure storage means for storing, when the microprocessor determines auxiliary power supply failure according to the auxiliary power supply failure signal, data of the auxiliary power supply failure.

* * * * *